United States Patent
Pattanaik et al.

(10) Patent No.: US 6,318,624 B1
(45) Date of Patent: Nov. 20, 2001

(54) SOLDER BALLTAPE AND METHOD FOR MAKING ELECTRICAL CONNECTION BETWEEN A HEAD TRANSDUCER AND AN ELECTRICAL LEAD

(75) Inventors: Surya Pattanaik, San Jose; Timothy C. Reiley, Los Gatos; Randall G. Simmons, San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/467,731

(22) Filed: Dec. 20, 1999

Related U.S. Application Data

(62) Division of application No. 08/678,654, filed on Jul. 11, 1996, now Pat. No. 6,046,882.

(51) Int. Cl.⁷ .................................................. B23K 35/14
(52) U.S. Cl. ........................... 228/56.3; 228/246; 228/254
(58) Field of Search ............................... 228/56.3, 180.22, 228/246, 234, 248.1; 428/576

(56) References Cited

U.S. PATENT DOCUMENTS

| | | | |
|---|---|---|---|
| 3,750,265 | * | 8/1973 | Cushman . |
| 4,020,987 | * | 5/1977 | Hascoe . |
| 5,029,748 | * | 7/1991 | Lauterbach et al. . |
| 5,299,730 | * | 4/1994 | Pasch et al. . |
| 5,427,865 | * | 6/1995 | Mullen, III et al. . |
| 5,620,129 | * | 4/1997 | Rogren . |
| 5,820,014 | * | 10/1998 | Dozier, II et al. . |
| 5,957,364 | * | 9/1999 | Socha . |
| 6,000,603 | * | 12/1999 | Koskenmaki et al. . |
| 6,046,882 | | 4/2000 | Pattanaik et al. ................... 360/104 |

OTHER PUBLICATIONS

U.S. application No. 08/678,654, Pattanaik et al., filed Jul. 11, 1996.

* cited by examiner

*Primary Examiner*—Tom Dunn
*Assistant Examiner*—Colleen P. Cooke
(74) *Attorney, Agent, or Firm*—Donald J. Pagel

(57) ABSTRACT

A solder balltape comprised of an elongated tail with a ball of solder formed at one end. A plurality of the balltape structures are positioned on a carrier strip of solder. The balltape is positioned in contact with a transducer pad on a magnetic read/write slider and an electrical lead pad. A pulse of focused laser radiation is directed at the ball part of the balltape and a right angle fillet joint is formed. A subsequent laser pulse or a sharpened blade is used to remove the tail from the newly formed fillet joint.

10 Claims, 8 Drawing Sheets

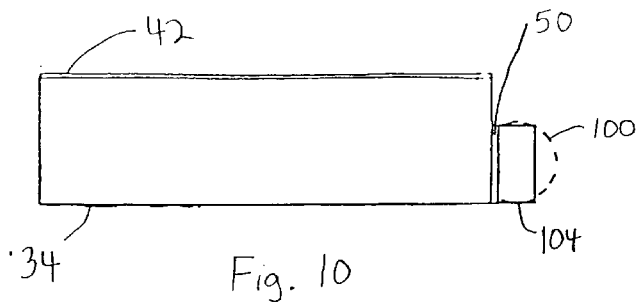
Fig. 10
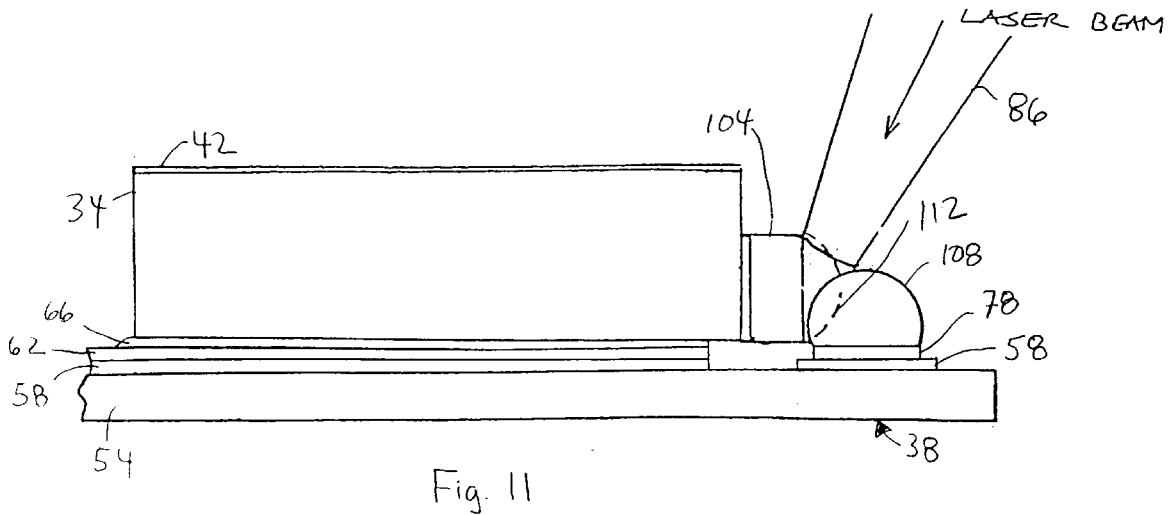
Fig. 11
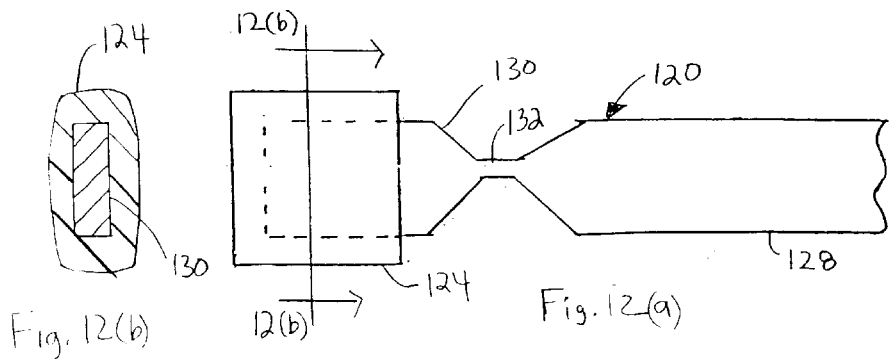
Fig. 12(a)
Fig. 12(b)

SOLDER BALLTAPE AND METHOD FOR MAKING ELECTRICAL CONNECTION BETWEEN A HEAD TRANSDUCER AND AN ELECTRICAL LEAD

This is a division of application Ser. No. 08/678,654, filed Jul. 11, 1996, now U.S. Pat. No. 6,046,882.

TECHNICAL FIELD

The present invention relates to a method for attaching a magnetic read/write transducer to an electrical lead and more specifically to a method that includes using a solder balltape and a laser to make the electrical connection between the transducer and a lead which is incorporated in an integrated suspension.

BACKGROUND ART

In conventional head gimbal assembly (HGA) technology utilized in magnetic disk drives, the slider is mechanically attached to the flexure of the suspension by epoxy bonding. The electrical connection between the thin film magnetic head transducer and the read/write electronics is made by twisted pairs of wires which run the length of the suspension. The ends of these wires are bonded to the gold transducer termination pads on the slider.

In a new generation of HGA technology, the suspension is comprised of a laminated structure. The twisted pairs of wires of the old technology are replaced by conductors that are etched into one of the layers of the laminated suspension. For example, U.S. Pat. No. 4,996,623 illustrates the use of a suspension having etched copper lead structures. In another variation of this technology, the conductors are formed by vapor deposition plating. The electrical connections between the head transducer and the conductors are achieved by soldering. Generally, a solder joint is established between a reflowed solder bump on the slider and either the copper lead pads or to solder bumps applied to the lead pads. In this methodology, the solder bump is applied to the slider at the wafer level. Application of the solder at this level leads to many problems, such as oxidation of the solder bump which inhibits good joint formation.

In general, the use of solder balls for attaching the slider to a slider support means is known in the art. For example, Ainslie et al., in U.S. Pat. No. 4,761,699, disclose the use of reflowed solder balls for making both the mechanical attachment of the slider to the suspension and the electrical connection of the transducer to the disk file read/write electronics. Additionally, Ainslie et al., in U.S. Pat. No. 4,789,914, disclose a soldering technique for making an electrical attachment of a cable to a transducer on the backside of a slider. In the semiconductor industry, electrical connections within a semiconductor device have long been made using Tape Automated Bonding (TAB) techniques. For example U.S. Pat. No. 4,814,855 illustrates the use of a laser technique to produce ball-like areas on the ends of leads that are used to make electrical connections in the semiconductor device.

SUMMARY OF THE PRESENT INVENTION

The present invention utilizes a laser technique to form solder balltapes which allow the soldering connections between the transducer and the etched leads to be formed entirely after the slider has been manufactured. Briefly, the preferred embodiment of the present invention is a solder balltape formed by directing a pulse of focused laser radiation at an end of a rectangular strip of Sn/Pb solder. The laser radiation causes a spherical head of solder to form on one end of the balltape with an elongated tail extending away from the head. The balltape is then positioned with the solder head in contact with the electrical pad of the read/write transducer and an electrical lead positioned on the flexure or slider support region of the suspension. A second pulse of laser radiation is used to melt the solder head. When the solder cools, the solder head forms a right angle fillet joint which electrically connects the electrical pad of the read/write transducer and the electrical lead. The tail is then removed from the balltape leaving a relatively smooth right angle fillet joint.

In the preferred embodiment the electrical lead is formed in the upper layer of a laminated material from which the suspension is formed. In some applications a second solder bump is positioned between the electrical lead and the solder ball tape before the right angle fillet joint is formed. In another application, the balltape is used to form a solder bump directly on the electrical pad of the read/write transducer before the slider is mounted on the suspension.

BRIEF DESCRIPTION OF THE DRAWINGS

FIG. 10 is a side view of the slider after the solder bump has been formed on the transducer electrical pad;

FIG. 11 is a side view of the slider containing a solder bump in position for connection to an electrical lead;

FIG. 12(*a*) is a top view of an alternative embodiment for a solder balltape according to the present invention;

FIG. 12(*b*) is a cross-sectional view taken along the line 12(*b*)—12(*b*) of FIG. 12(*a*);

DETAILED DESCRIPTION OF THE PREFERRED EMBODIMENT

Figure 1:
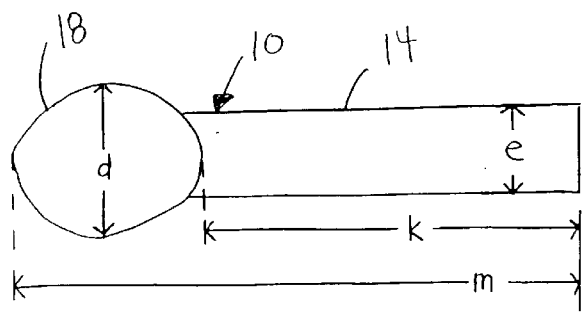
FIG. 1 is a schematic top view of a solder balltape according to the present invention.

FIG. 1 is a schematic diagram of a balltape 10 comprised of a tail 14 and a ball 18. The tail 14 is a rectangular structure having a width "e" and a length "k." The ball 18 is a spheroidally shaped structure having a diameter "d" which is greater than the width "e." The balltape 10 has a total length "m" measured from the tip of the ball 18 to the end of the tail 14.

Figure 2:
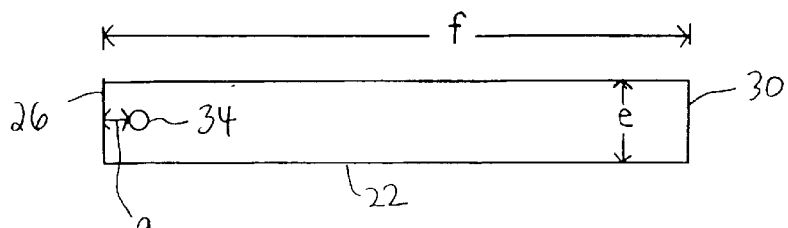
FIG. 2 is a top view of a strip of solder used to make the balltape of FIG. 1.

FIG. 2 illustrates a strip 22 having a distal end 26 and a proximal end 30. The strip 22 is comprised of a solder material such a tin-lead alloy (Sn—Pb alloy), a tin-gold alloy (Sn—Au alloy) or any other type of solder material that can be formed into sheets or wires. The strip 22 is rectangular in shape and cross section, and has the same width "e" as the tail 14 shown in FIG. 1. The strip 22 has a length "f" which is greater than the length "m" of the balltape 10. For reference purposes, a region 34 is illustrated on the strip 22. The region 26 is positioned a distance "g" from the distal end 26 approximately in the center of the strip 22. The proximal end 30 of the strip 22 can remain connected to a carrier strip of solder as is illustrated later with respect to FIG. 13.

Figure 13:
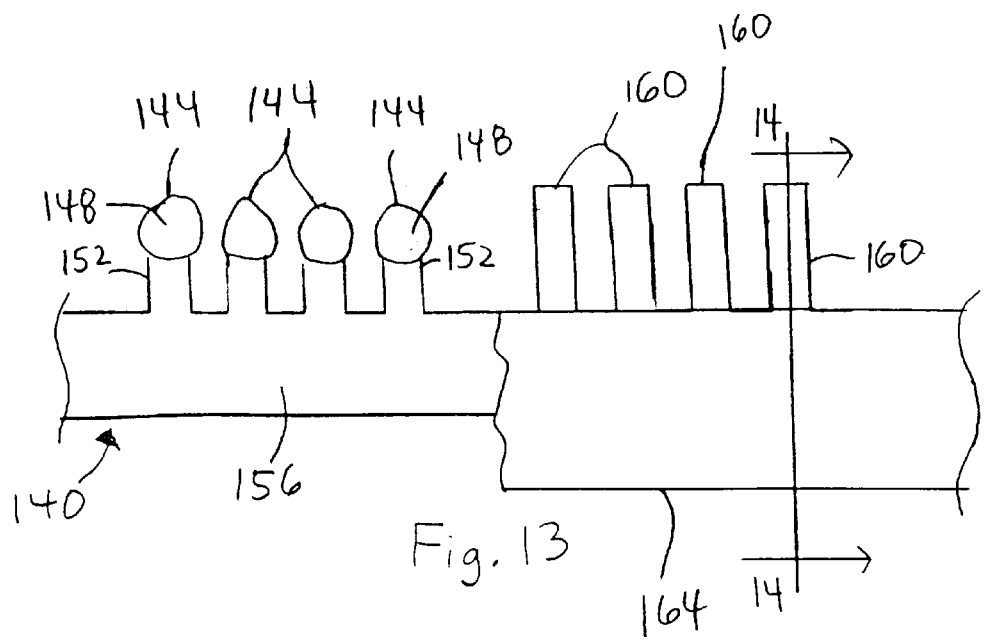
FIG. 13 is a plan view of a balltape strip according to the present invention.

In one embodiment, the strip 22 is formed using a die punch to punch a plurality of rectangular strips 22 from a sheet of 60 Sn/40 Pb solder (60% tin, 40% lead) having a thickness of approximately 80 µm. In a preferred embodiment, the strip 22 remains connected to a carrier tape as is illustrated in FIG. 13. The strips 22 so made have a length f of approximately 1.5 mm and a width e in the range of approximately 5–100 µm. Other methods that could be used to form the strips 22 include feeding long strips of solder through a rotating -meshed punch or a reciprocating punch. The strips 22 can be formed at the edge of the sheet of solder or in the middle.

The balltape 10 is formed by directing a pulse of laser radiation at the region 34 of the strip 22. The laser pulse causes the solder material in the strip 22 to liquefy and surface tension causes the liquefied material to form an approximately spherical ball. When the laser radiation ceases to irradiate the region 34 (i.e. when the pulse is over), this ball resolidifies into the spheroidally shaped ball 18 illustrated in FIG. 1. In the preferred embodiment, the laser is a focused Nd:YAG type laser operating at 210 V, with the pulse length being about 2 milliseconds (ms). The laser beam is oriented perpendicular to the surface of the strip 22 (i.e. perpendicular to both the length "f" and the width "e"). Generally, an optical system, such as a charge coupled device (CCD) video camera is used to view the strip 22 so that the laser pulse can be aimed at the region 34. The laser beam is focused so that an approximately 100 µm spot on the strip 22 is irradiated.

Figure 3:
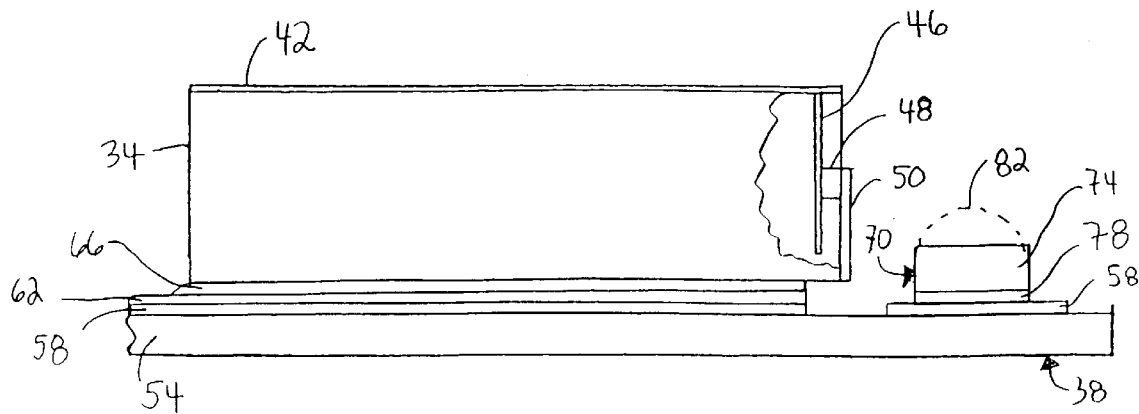
FIG. 3 is a side view of a head gimbal assembly before an electrical connection is formed between the transducer and an electrical lead.

FIG. 3 illustrates a slider 34 mounted on a laminated (integrated) suspension 38. The slider 34 comprises an air-bearing surface (ABS) 42, a transducer 46 (such as a thin film head), a connector 48 and a plurality of connector pads 50 (only one is shown). The connector pads 50 are positioned on the outside of the slider 34 and provide sites for establishing electrical contact with the transducer 46. The pads 50 are typically copper pads plated with immersion gold to preserve solderability. However, nothing in this invention limits the pad metallurgy to copper with immersion gold. Any solder wettable metallurgy, including plated gold or nickel/gold finishes can be used. The connector 48 electrically connects the pad 50 and the transducer 46.

The ABS 42 is a part of the ceramic structure known as the slider, which carries the recording transducer. In the preferred embodiment the slider 34 carries a magnetic read/write head of the type referred to as a thin-film magnetoresistive head, and is typically used for reading data from and writing data to a hard magnetic disk. In the preferred embodiment, the slider 34 is a nano slider having dimensions of about 2.0 mm×1.6 mm×0.425 mm. However the invention may be used with other types of heads, such as inductive heads, and other sizes of sliders.

The suspension 38 is formed from a laminated sheet comprised of a first layer 54, which is typically stainless steel, a second layer 58, which is typically a dielectric material such as a polyimide, and a third layer 62, which is typically a high strength copper alloy such as the copper-nickel-silicon-magnesium alloy known as C7025 (full hard heat temper) manufactured by Olin Brass (composition 96.2% Cu; 3% Ni; 0.65% Si; and 0.15% Mg). Other suitable alloys include a high strength beryllium copper alloy (composition: 97.2–98.4% Cu; 0.2–0.6% Be; and 1.4–2.2% Ni, such as Brush Wellman beryllium copper alloy 3 (C17510) with an HT temper);. a high strength brass alloy (composition: 97.5% Cu; 2.35% Fe; 0.03% P; and 0.12% Zn, such as Olin Brass copper alloy C194 with an ex. spring temper); and a high strength titanium copper alloy (composition: 96.1–96.6% Cu; and 2.9–3.4% Ti, such as Nippon Mining titanium copper alloy with a TiCuR1-EHM temper). The invention is not limited to use with these materials.

The slider 42 is attached to the suspension 38 by an adhesive layer 66, which is typically an adhesive such as a cyanoacrylate adhesive, epoxy and/or urethane acrylate.

In FIG. 3, a conductor lead pad 70 comprises a flattened solder bump 74 which is positioned on a lead 78. The lead 78 is a part of the third layer 62, and is positioned on top of the second layer 58. When exposed to radiation from a laser, the upper part of the flattened solder bump 74 assumes the rounded shape 82 indicated by the dashed line in FIG. 3. Typically, the lead 78 is plated with gold to preserve solderability, but other solder wettable metallurgy's can also be used.

Figure 4:
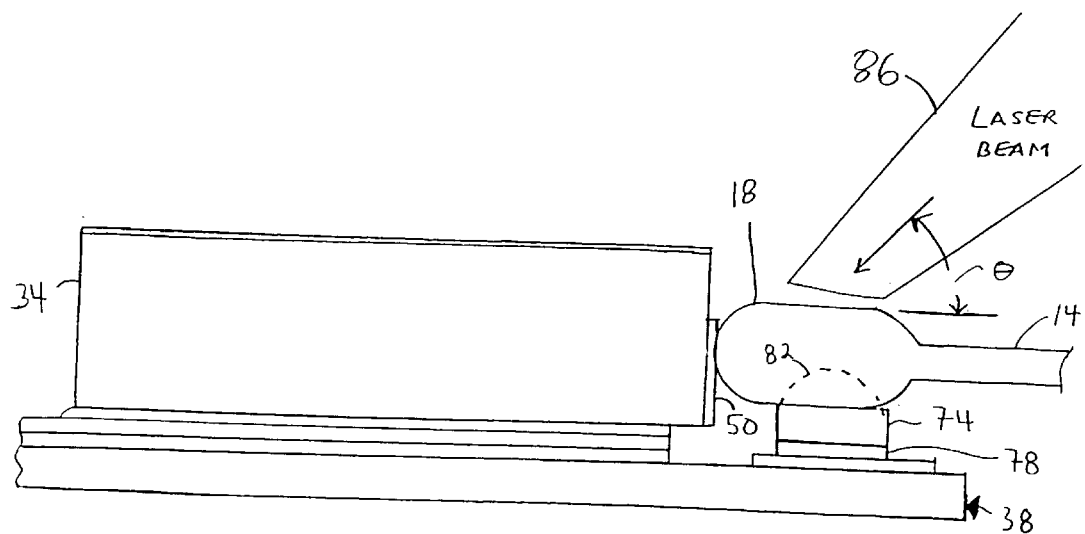
FIG. 4 is a side view of a head gimbal assembly with a balltape in position to connect the transducer to the lead according to the present invention.
Figure 5:
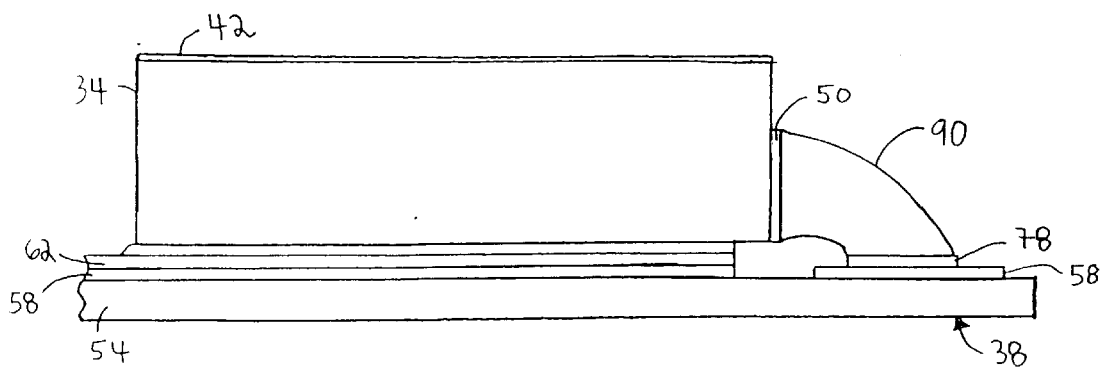
FIG. 5 is a side view showing a completed fillet joint.

FIG. 4 illustrates the balltape 10 positioned in physical contact with the connector pad 50 and the flattened solder bump 74. The tail 14 is oriented parallel to the suspension 38. In other embodiments it would be permissible for a small amount of space to separate the ball 18 from the pad 50 or the bump 74. For purposes of this application, the phrase "in the vicinity of an object" means that the ball 18 is either touching the object or is separated from the object by a relatively small amount of space. A beam of laser radiation 86 is directed at the ball 18 after it is positioned in contact with the connector pad 50 and the flattened solder bump 74. The laser radiation causes the ball 18 to melt and adhere to the connector pad 50. Simultaneously, the solder bump 74 melts, assumes the rounded shape 82 and mixes with the ball 18, thereby forming a right angle fillet joint as illustrated in FIG. 5. The angle of incidence of the laser beam 86 with the ball 18 is defined as an angle θ. Typically, the angle θ is about forty-five degrees. In other words, if the flattened surface of the ball 18 is parallel to the ground, the center of the laser beam 86 will strike the flattened surface of the ball 18 at a forty-five degree angle.

In FIG. 4, the ball 18 is shown as being slightly flattened. It has been determined that flattening the ball 18 improves the formation of right angle fillet joints by promoting thermal contact between the solder bump 74 or the lead 78. The flattening of the ball 18 is accomplished as follows: After the ball tape 10 has been formed, the ball 18 is passed between plates which compress the balls to a given thickness. The flattened solder bump 74 is formed by screen printing solder paste, reflowing and pressing using a die; or by electroplating solder.

FIG. 5 illustrates the fillet joint 90 formed when the beam of laser radiation 86 strikes the ball 18 and after the tail 14 has been removed. As can be seen, the flattened solder bump 74 has combined with the ball 18 to form a continuous solder connection between the lead 78 and the pad 50. It should be appreciated that the joint 90 establishes an electrical connection between the lead 78 and the pad 50, thereby electrically connecting the transducer 46 to the read/write circuitry of the disk drive. Typically, four of the joints 90 are formed, thereby connecting the transducer 46 to four of the leads 78 (see FIG. 16). As noted previously, the lead 78 is part of the third layer 62 and hence comprises the same materials as the third layer 62. Generally, the lead 78 comprises an elongated conducting structure formed in the third layer 62, and which extends along the length of the suspension 38 before connecting to the data read/write electrical components of the disk drive. Typically, the lead 78 is formed by etching a piece of laminated material comprised of the layers 54, 58 and 62. However, the invention is not limited to leads of this type and the lead 78 can also be formed by vapor deposition or any other suitable technique for establishing a conductive lead on a suspension. Right angle fillet joints 90 formed using the laser/solder techniques described in this application are extremely strong and reliable joints.

In the preferred embodiment, the laser conditions used to form the fillet joint 90 are slightly different from the conditions used to form the balltape 10. Specifically, two 20 millisecond pulses from an Nd:YAG laser operating at 176 V are focused to an approximately 100 μm spot. Additionally, an optical system comprised of a CCD video camera is used to help aim the laser beam at the ball 18.

Figure 6:
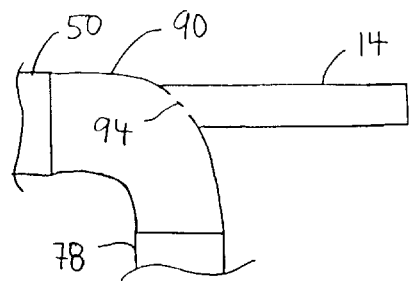
FIG. 6 is a side view of a fillet joint with a tail still attached.

FIG. 6 illustrates the fillet joint 90 before the tail 14 has been removed. Several methods can be used to remove the tail 14 from the fillet joint 90. In the preferred embodiment, the tail 14 is removed with a laser technique. In this approach, after the joint 90 has been formed and solidified, a second laser pulse is directed at the line 94. This severs the tail 14 from the joint 90 without the use of additional force. In an alternative embodiment, a sharp object, such as a knife or sharpened blade, is used to sever the tail 14 from the joint 90, for example at a line 94. In the laser technique, a small sphere of solder forms on the joint 90 adjacent to where the tail 14 has been removed (i.e. adjacent to the line 94). This small sphere then merges into the joint 90 leaving a relatively smooth surface on the fillet joint 90.

Another approach to removal of the tail 14 is to simply pull the tail 14 away from the joint 90. A key objective of this technique is to obtain a fracture of the tail near to the point where the melted joint formed. Many solders, such as 60/40 solder and 63/37 solder, exhibit superplastic behavior and thus possess the undesirable property of stretching a good deal before breaking. A solution to this problem is to use solders in which the melted and solidified solder has a lower yield strength than unmelted solder. This can be accomplished in many systems by choosing a solder composition away from the eutectic composition (where super plastic behavior usually exists). For example, an improvement in solder breakpoint should be achieved with 80/20 or 40/60 Sn/Pb solder, rather than the 60/40 solder normally used.

Figure 7:
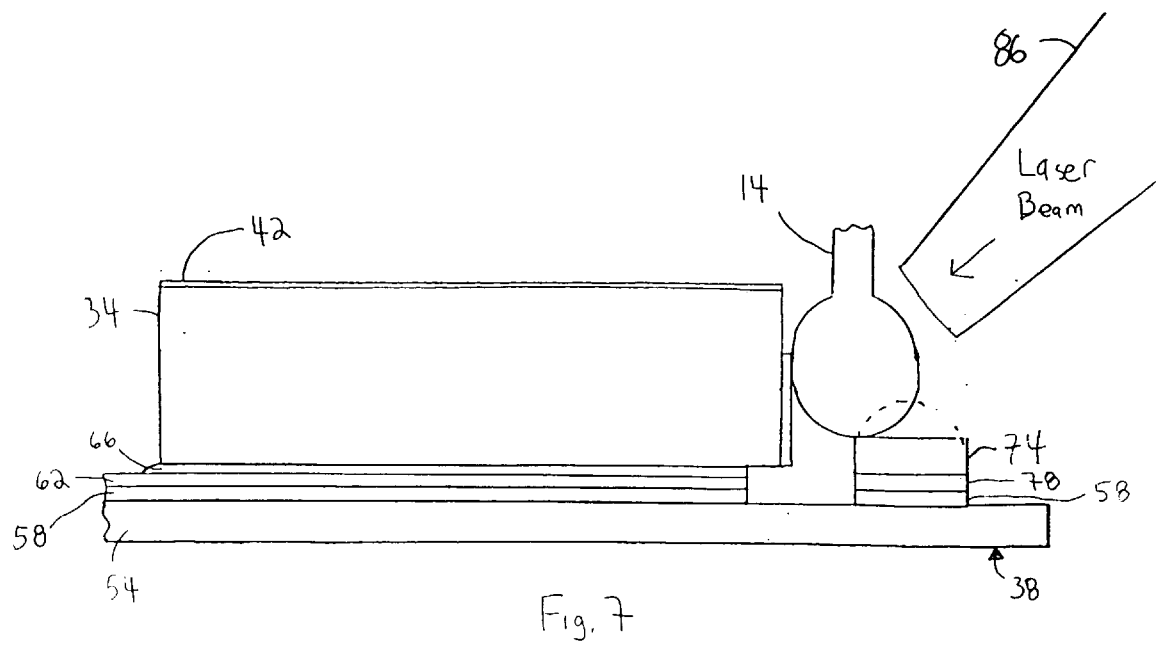
FIG. 7 is a side view of a head gimbal assembly with a balltape positioned in an alternative position for connecting the transducer to the lead.

FIG. 7 illustrates an alternative method for forming the fillet joint 90, in which the balltape 10 is oriented with the tail 14 pointing up, perpendicular to the length of the suspension 38, and the flattened ball 18 is in physical contact with the connector pad 50 and the flattened solder bump 74.

Figure 8:
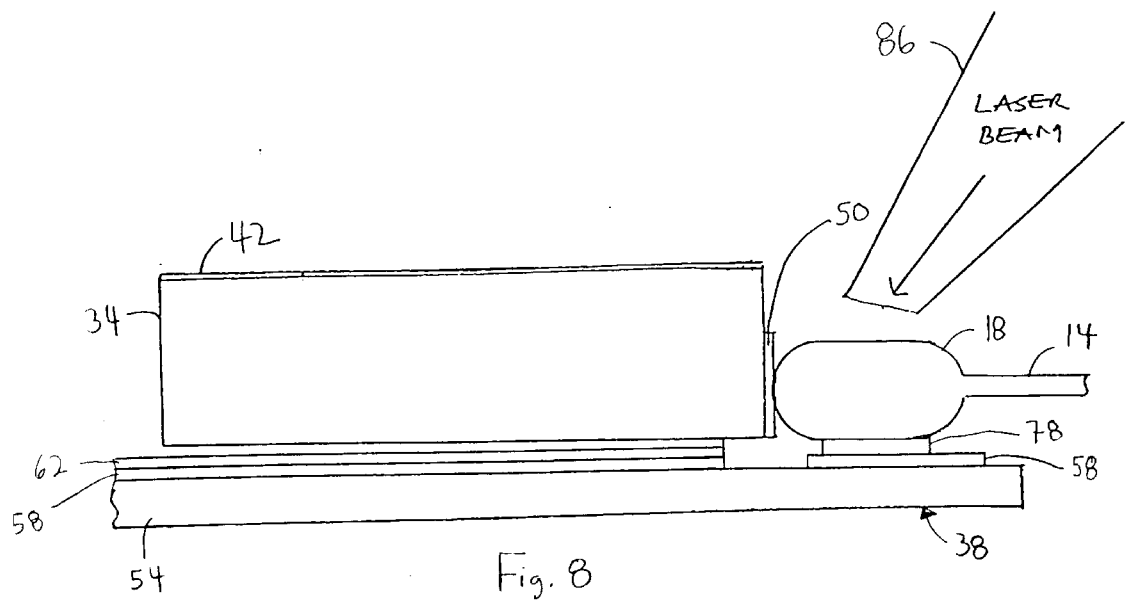
FIG. 8 is a side view of a head gimbal assembly with a balltape positioned in another alternative position for connecting the transducer to the lead.

With respect to FIGS. 4 and 7, it should be appreciated that the use of the flattened solder bump 74 is optional. Fillet joints, such as the joint 90 can be formed by placing the balltape 10 directly on, or in the vicinity of the electrical lead 78. The use of the solder bump 74 merely facilitates formation of the joint 90. FIG. 8 illustrates the situation where a fillet joint 90 is formed using the balltape 10 without use of the flattened solder bump 74. In this case, the end of the electrical lead 78 functions as the conductor lead pad (also called a lead termination pad).

Figure 9:
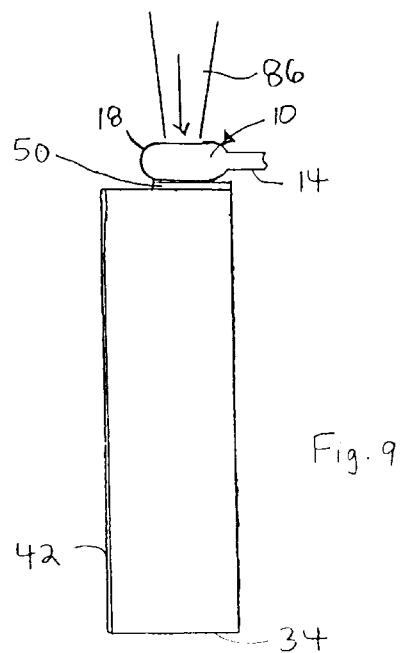
FIG. 9 is a side view of a slider with a balltape positioned for forming a solder bump on the transducer electrical pad of a slider before the slider is mounted on a suspension.

FIG. 9 illustrates an alternative method for forming the fillet joint 90. The slider 34 is held in an upright position with the connector pad 50 pointing up. The ball tape 14 is positioned with the ball 18 in contact with the pad 50 and the tail 14 extending outward parallel to the ground. Note that the ball 18 has been flattened as described previously. A pulse from the laser beam 86 is directed at the ball 18 as described previously. The laser radiation causes the ball 18 to melt and become attached to the pad 50. The tail 14 is then removed from the ball 18 leaving arounded solder ball 100 attached to the pad 50.

FIG. 10 shows the slider 34 with the rounded solder ball 100 illustrated by dashed lines. Typically, the rounded solder ball 100 is flattened, for example by arranging several sliders in a fixture and pressing them in a die to yield a flattened solder bump 104. Notice that in this method, the solder ball 100 is being attached to a fully manufactured slider before the slider has been attached to a suspension.

FIG. 11 illustrates the slider 34, bearing the flattened solder bump 104, after the slider has been attached to the suspension 38. Preferably, a rounded solder ball 108 is attached to the lead 78 before the slider 34 and solder bump 104 are mounted on the suspension 38. However, the solder ball 108 could be applied after the slider 34 is mounted. A pulse from the laser 86 is used to melt the solder bump 104 and the solder ball 108. When melted, the solder bump 104 reassumes a rounded form 112 which mixes with the ball 108 to form a right angle fillet joint similar to the joint 90 shown in FIG. 5.

The solder ball 108 is formed on the lead 78 by either by screening solder paste or by electroplating. The usefulness of this method is that it allows the solder bump 104 and the solder ball 108 to be positioned before the slider 34 is attached to the suspension 38.

FIG. 12(a) illustrates a plated solder balltape 120 which is an alternative to the balltape 10. The plated balltape 120 comprises aplated head 124, atail 128, ahead core 130 and a notch 132. The tail 128 and core 130 comprise a continuous piece of material such as a strip of copper or another metal or alloy. The notch 132 is an optional feature and comprises a portion of the tail 128 that has been narrowed in order to facilitate removal of the tail. The plated balltape 120 is formed by plating a tin based solder, such as 60% Sn–40% Pb, on the head core 130, with the rest of the balltape 120 being masked to prevent plating. The roughly rectangular shape of the head 124 results from the plating process. FIG. 12(b) illustrates that the head 124 completes surrounds a part of the core 130.

The plated balltape 120 is used in the same manner that the balltape 10 is used. For example, the plated balltape 120 can be substituted for the balltape 10 in FIGS. 4 and 7 to yield right angle fillet joints, such as the joint 90. Additionally, when the balltape 120 is used, a small amount of the material that comprises the tail 128 will become incorporated in the fillet joint. For certain materials, such as copper, this strengthens the fillet joint.

FIG. 13 illustrates a balltape strip 140 comprised of a plurality of balltape structures 144. The structures 144 comprise a ball 148 and a tail 152 which are completely analogous to the ball 18 and tail 14 (shown in FIG. 1), except that the end of the tail 152 opposite to the ball 148 is attached to a solder tape 156. The tape 156 is comprised of the same materials described previously with respect to the balltape 10. Also shown in FIG. 13 are a plurality of balltape structures 160 before the ball 148 has been formed. The structures 160 have the same dimensions as the strips 22 shown in FIG. 2, namely a length of approximately 1.5 mm and a width of approximately 50–100 µm. The balls 148 are formed by irradiating the balltape structures 160 with a focused laser pulse as was described previously with respect to the ball 18. The balls 148 have a width wider than the width of the structure 160 just as the ball 18 is wider than the strip 22. A protective carrier tape 164 is attached to the solder tape 156 to reinforce the balltape strip 140 and to provide easier handling of the strip 140.

Figure 14:
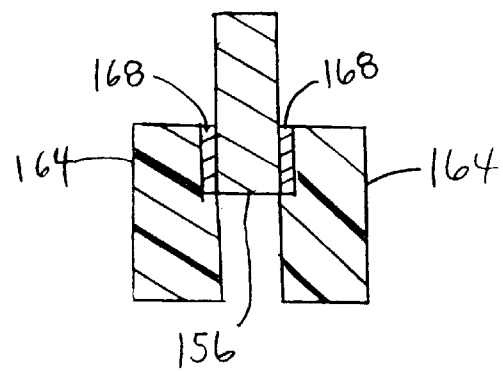
FIG. 14 is a cross-sectional view taken along the line 14—14 of FIG. 13.

FIG. 14 illustrates that the solder tape 156 is positioned between two pieces of the carrier tape 164 and that a pair of adhesive layers 168 are used to secure the tape 164 to the tape 156. Typically the carrier tape 164 is made from a thin but strong material such as 5 mil thick Mylar brand polyester film.

Figure 15:
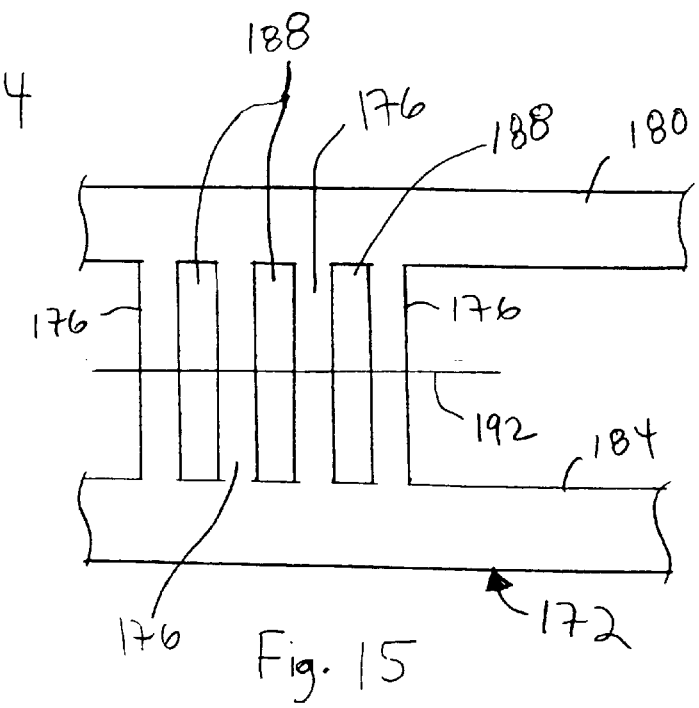
FIG. 15 is a plan view of a processed strip of solder that can be used to form a ball tape strip.

FIG. 15 illustrates a solder strip 172 in which a plurality of rectangular solder strips 176 are positioned between a first solder strip 180 and a second solder strip 184. A space 188 separates each pair of adjacent strips 172. A reference line 192 is drawn at the approximate middle of the strips 176. By severing the strips 176 along the line 192, two pieces of the balltape strip 140 are formed. The severing can be accomplished with a sharp object, thereby yielding the structures 160, or with a laser, thereby yielding the structures 144.

Typically the strip 172 is formed by using a die punch to punch out the spaces 188 from a rectangular sheet of solder material, such as the sheet of 60 Sn/40 Pb solder (60% tin, 40% lead) having a thickness of approximately 80 µm described previously with respect to FIG. 2. Of course other solder materials and dimensions can be used.

Figure 16:
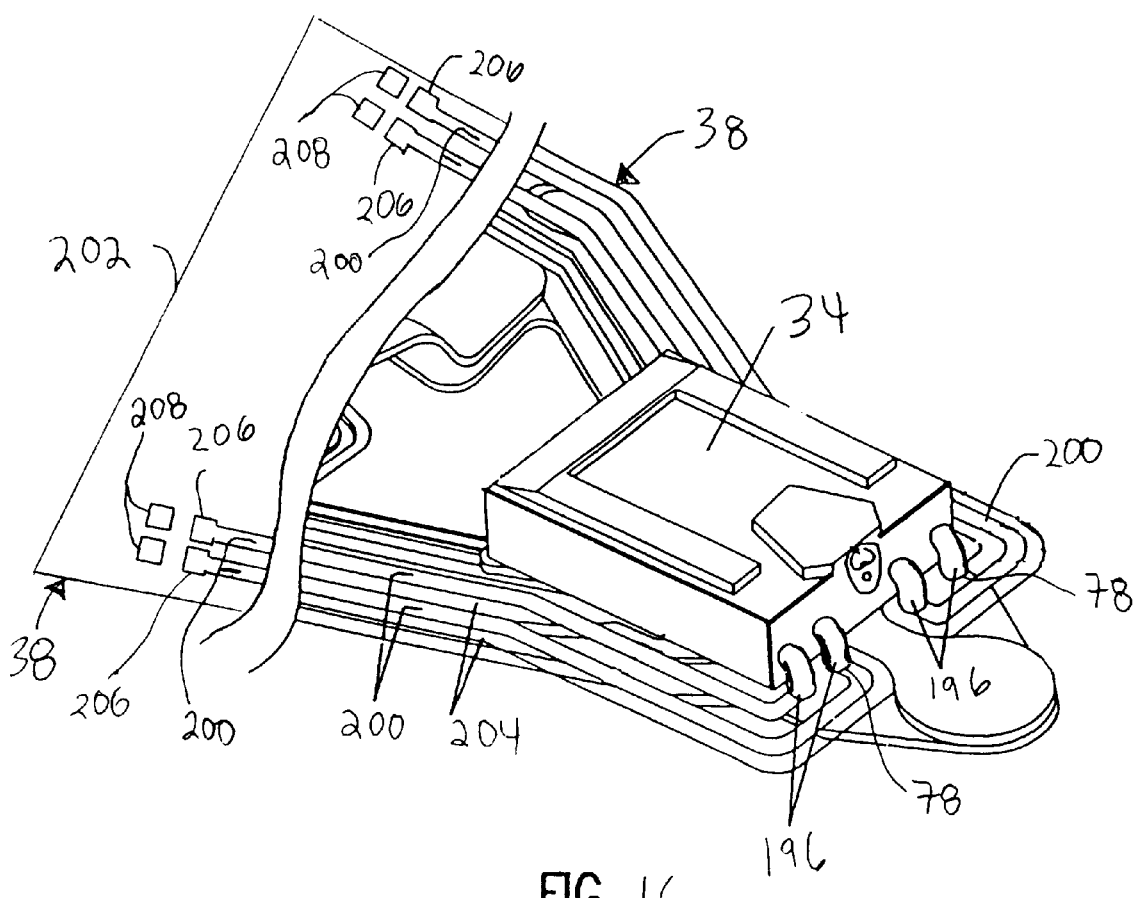
FIG. 16 is an isometric view of a slider having four fillet joints connecting the transducer to the electrical leads.

The usefulness of the strips 172 and 140 are that they can be adapted to automated procedures where a length of the strip 172 or 140, either in straight or rolled form, is used in an automated process to make multiple numbers of the fillet joints 90. For example, FIG. 16 illustrates the slider 34 having four fillet joints 196 (which are identical to the joint 90). The four joints 196 can be formed by positioning the strip 140 so that one of the balls 144 is in contact with a transducer pad 50 and a lead pad 78 (or solder bump 74) as described previously with respect to FIGS. 3–8. A laser pulse is then directed at each of the balls 144 to form the four joints 196 and the tails 152 are removed.

To improve the shelf life of the strip 140, the balltape structures 144 can be plated with a metal, such as gold, that prevents or slows oxidation of the solder material used to make the balltape structures 144.

FIG. 16 also illustrates a plurality of elongated electrical leads 200 which are formed in the third layer 62 and which extend from a back end 202 of the suspension 38, and along the length of the suspension 38 before terminating at the pads 78. A space 204 separates adjacent leads 200 and extends down to the second layer 58. At the back end 202, the leads 200 terminate in a plurality of back termination pads 206. A plurality of read/write circuit termination pads 208 are positioned near the termination pads 206. The termination pads 206 are just the ends of the leads 200 and are comprised of the same material as the lead 78, namely the third layer 62. The pads 208 provide electrical connection to the circuitry that controls the read/write functions of a disk drive.

The methods of the present invention can be used to form right angle fillet joints, identical to the joint 90, which connect the pads 206 and 208. For example, four joints can be formed by positioning the strip 140 (from FIG. 13) so that one of the balls 144 is in contact with a termination pad 206 and a termination pad 208 as described previously with respect to FIGS. 3–8. A laser pulse is then directed at each of the balls 144 to form the four joints. The tails 152 are then removed.

Figure 17:
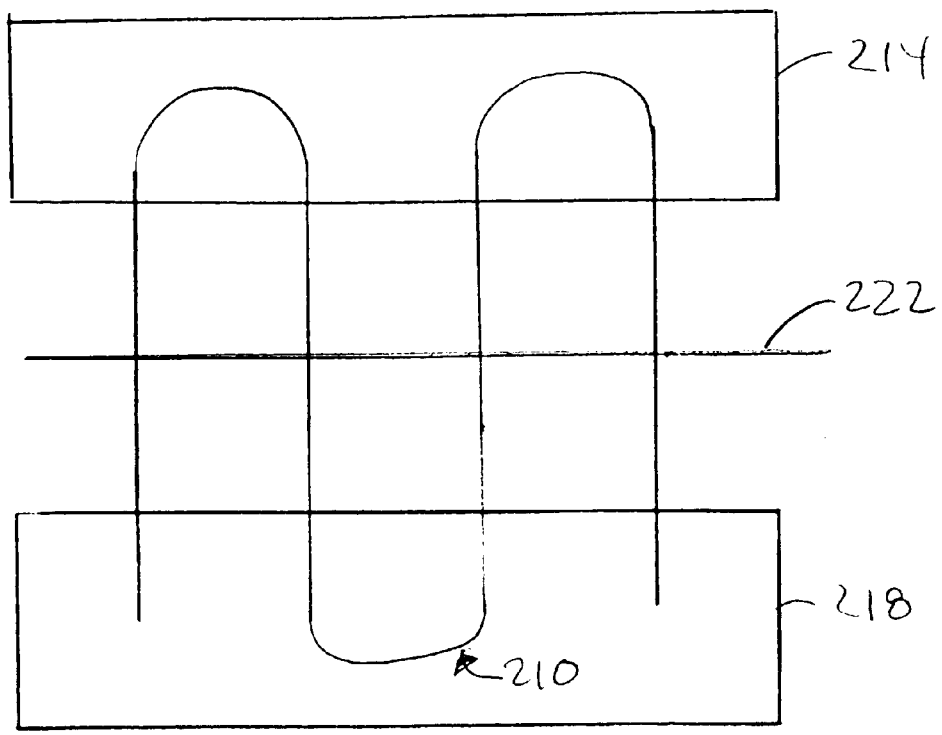
FIG. 17 is a plan view of a balltape strip formed from solder wire.
Figure 18:
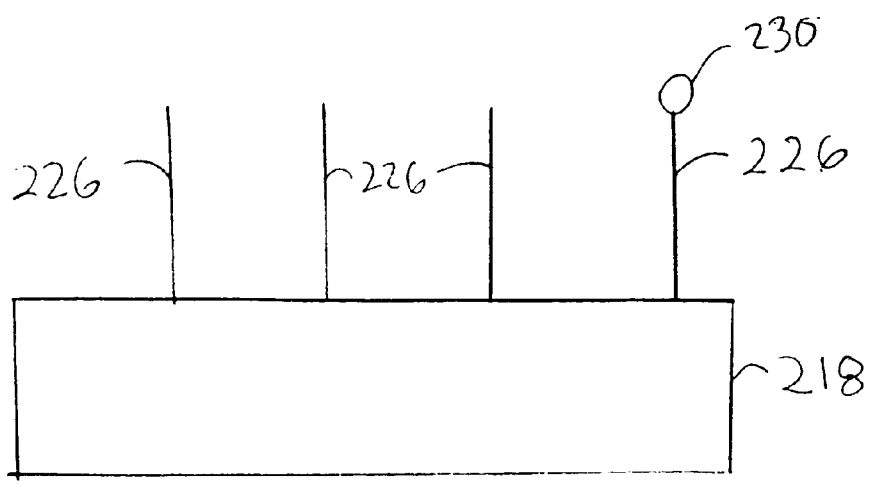
FIG. 18 is a plan view of another balltape strip formed from solder wire.

FIG. 17 illustrates an alternative to the strip 172 in which a length of solder wire 210 is suspended from an upper frame 214 and a lower frame 218. If severed along a reference line 222 (by analogy the line 192), a plurality of solder wires 226 are formed. The wires 226 can be used analogously to the strip 140 to form multiple fillet joints 90. Typically the wire 210 is cylindrical in shape with a diameter of approximately 100 microns, and is comprised of the same types of solder materials as were described previously with respect to the balltape 10. Of course other materials, dimensions and shapes could be used. The cut along the line 222 can be completed by a sharp object or with a laser as described previously with respect to FIG. 15. The frames 214 and 218 can be polyester like the carrier tape 164. Balls 230 are formed on the wires 226 with a laser before use.

Figure 19:
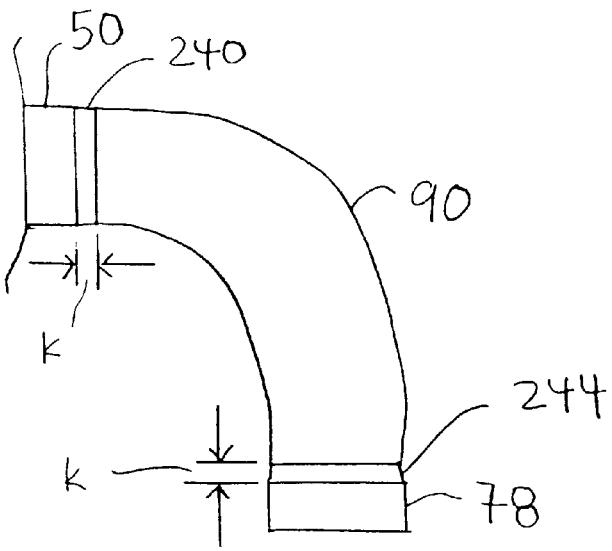
FIG. 19 is a side view of a fillet joint having two bands of intermetallic compounds.

FIG. 19 illustrates the fillet joint 90 as having a first band 240 and a second band 244. The bands 240 and 244 represent layers of intermetallic compounds (IMC). The bands 240 and 244 have a width k which is less than or equal to one micron. The significance of the bands 240 and 244 is as follows:

Most common soldering alloys contain tin as a constituent, and the most common base metal to be soldered is copper or copper alloy with or without a gold finish. During conventional soldering operations (infrared or convective furnace reflow, hot gas reflow etc.), the molten solder interacts with the base metal and/or the finish to form IMC. IMC can be copper-tin, copper-gold or other combinations. IMC forms a distinct layer between the base metal (e.g. copper) and the solder. The thickness of this layer is controlled by the reflow temperature and time. In conventional reflow processes, the time the solder stays molten can be from a few seconds to a few minutes. As a result, an IMC layer of several microns is formed. Moreover, due to a slower solidification process following reflow, the grain size of the solder is fairly large, on the order of several microns (5–10 typically) due to diffusional processes aiding in grain growth.

Laser beam reflow involves extremely rapid heating and cooling. By using a laser beam to melt the solder preform, the solder remains molten only for a very small fraction of a second. The reflow times are in the range of 1–50 milliseconds. As a result the solder joint 90 has two unique features: a) an IMC layer which is extremely thin, less than one micron: and b) an extremely fine grain structure, in the range of 0.1–2.0 microns in size. These features provide excellent mechanical properties and reliability to the joint 90 and can be easily identified by cross-sectioning of the joint.

Joints of the present invention are characterized in that they will have at least one IMC layer that is 1 $\mu$m or less. Typically, joints 90 prepared according to the laser techniques of the present invention. the thicknesses of the IMC layer 240 and the IMC layer 244 will each be 1 $\mu$m or less. However, in cases where the flattened solder bump 74 is used to facilitate joint formation, the IMC layer adjacent to the bump 74 will be thicker. Therefore, joints of the present invention are usually characterized by at least one IMC layer that is 1 $\mu$m or less.

Although the present invention has been described in terms of the presently preferred embodiment it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A solder balltape comprising:
   an elongated tail having a distal end, a proximal end and a width e; and
   a ball abutting the distal end of the tail, the ball having a width d which is greater than the width e, the ball and the elongated tail being comprised of a solder material.

2. A solder balltape strip comprising:
   a first balltape structure comprised of a first elongated tail having a distal end, a proximal end and a width e, and a first ball abutting the distal end of the first tail, the first ball having a width d which is greater than the width e;
   a second balltape structure comprised of a second elongated tail having a distal end, a proximal end and a width e, and a second ball abutting the distal end of the second tail, the second ball having a width d which is greater than the width e; and
   a base strip attached to the proximal end of the first tail and to the proximal end of the second tail, the first balltape structure, the second balltape structure and the base strip all being comprised of a solder material.

3. The solder balltape strip of claim 2 further comprising:
   a first support structure; and
   a second support structure, with the base strip being positioned between the first support structure and the second support structure.

4. The solder balltape strip of claim 3 wherein the first support structure comprises polyester.

5. The solder balltape strip of claim 2 wherein the first ball is formed by electroplating a solder material on the first elongated tail.

6. The solder balltape strip of claim 2 wherein the first ball is formed by irradiating the distal end of the elongated tail with a laser.

7. A solder balltape strip comprising:
   a first balltape structure comprised of a first elongated tail having a distal end, a proximal end and a diameter e, and a first ball abutting the distal end of the first tail, the first ball having a diameter d which is greater than the diameter e, the first elongated tail comprising a length of cylindrically shaped solder wire;
   a second balltape structure comprised of a second elongated tail having a distal end, a proximal end and a diameter e, and a second ball abutting the distal end of the second tail, the second ball having a diameter d which is greater than the diameter e, the second elongated tail comprising a length of cylindrically shaped solder wire; and
   a support strip attached to the proximal end of the first elongated tail and to the proximal end of the second elongated tail.

8. The solder balltape strip of claim 7 wherein the cylindrically shaped solder wire comprises tin/lead solder.

9. The solder balltape strip of claim 2 wherein the first balltape structure and the second balltape structure are plated with a metal that inhibits oxidation.

10. The solder balltape strip of claim 2 wherein the solder material has a composition away from the eutectic composition.

* * * * *